(12) United States Patent
Browen et al.

(10) Patent No.: US 7,496,474 B2
(45) Date of Patent: Feb. 24, 2009

(54) DYNAMIC ON-CHIP LOGIC ANALYSIS

(75) Inventors: Adam S. Browen, Colorado Springs, CO (US); Craig Chafin, Colorado Springs, CO (US); Jeffery K. Whitt, Colorado Springs, CO (US); Steve A. Olson, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/280,639

(22) Filed: Nov. 16, 2005

(65) Prior Publication Data

US 2007/0112544 A1    May 17, 2007

(51) Int. Cl.
*G06F 11/30* (2006.01)
*G21C 17/00* (2006.01)

(52) U.S. Cl. .................................. 702/183

(58) Field of Classification Search ............... 702/117, 702/118, 182–185, 189
See application file for complete search history.

(56) References Cited

U.S. PATENT DOCUMENTS

| | | | | |
|---|---|---|---|---|
| 6,389,558 | B1* | 5/2002 | Herrmann et al. | 714/39 |
| 7,051,239 | B2* | 5/2006 | Litt | 714/42 |
| 2003/0097615 | A1* | 5/2003 | Corti et al. | 714/37 |
| 2004/0054815 | A1* | 3/2004 | Carlton, III | 710/1 |
| 2006/0156290 | A1* | 7/2006 | Johnson et al. | 717/127 |

* cited by examiner

*Primary Examiner*—Michael P Nghiem
(74) *Attorney, Agent, or Firm*—North Weber & Baugh LLP

(57) ABSTRACT

An apparatus and a method for analyzing signals within an integrated circuit are described. In one embodiment of the present invention, internal IC signals are tapped, sampled and stored according to one or more sampling criteria. The signals may be taken from multiple locations within the IC and the information stored may include data, timing information, control data and other such information related to the tapped signals. The stored information may be provided to an external device for analysis.

14 Claims, 4 Drawing Sheets

DYNAMIC ON-CHIP LOGIC ANALYSIS

BACKGROUND

A. Technical Field

The present invention relates generally to chip testing, and more particularly, to on-chip analysis and storage of internal integrated circuit signals.

B. Background of the Invention

The importance of integrated circuit ("IC") technology in various markets and applications is well known. IC technology has progressively evolved resulting in a large number of extremely complex integrated circuits comprising millions of electronic components such as transistors, diodes, resistors, etc. These complex integrated circuits are prone to errors and failure. In order to address these errors, an integrated chip often needs to be tested to address various performance issues of components within the chip.

The complexity of today's IC makes the task of chip-testing more challenging. It is often not possible or quite tedious to analyze a specific IC signal, which may be associated with a particular process being performed within the IC.

Current methods for identifying errors within a chip may require difficult and complex procedures to locate a portion of the IC that has failed. In one example, a chip may be debugged by sending the signals from the chip into a multiplexer so that individual signals may be analyzed. For instance, to examine failure on internal IC signals, the signals may be sent to an external logical multiplexer such as a TEST MUX in which a designer may select the required signal having the problem, amongst various other extra signals coming out of that IC.

The multiplexer can then be used to route the selected signals to an analysis device that may be used by a test engineer. The number of internal signals that are selected may be determined using a hardware-selector that generally goes through a package pad or pin. However, when an attempt to multiplex the internal logical signals to the physical world has to be made, it is necessary to consider signal characteristics such as clocking domains and routing constraints of the desired signals. These characteristics may not be able to be retrieved from the multiplexer or may be inappropriately modified by the multiplexer or hardware selector, which makes the analysis of the signals difficult. Further, greater granularity may be required to analyze different signal groups across different clock domains.

Another approach is to drill into the chip and insert probes for tapping a trace within an IC and extracting data on the trace. One skilled in the art will recognize the inefficiencies of this method and costly equipment required to perform the method. Additionally, this process may also be very time consuming and may take several hours to probe a single IC net.

The approaches mentioned above lack the ability to dynamically select an internal signal within the IC. Furthermore, these approaches fail to address signal routing and timing complications that may be relevant in testing the IC. Additionally, these methods lack the ability to multiplex out signals from different clock domains; making it less flexible across various signal groups.

Therefore, there is a need for an apparatus and a method that address the above-described limitations.

SUMMARY OF THE INVENTION

The present invention provides an apparatus and a method for dynamic on-chip logic analysis. In one embodiment of the present invention, internal IC signals are selected, sampled and stored within a memory buffer. The memory buffer may store both state and/or timing information of those signals. The different signal groups may be sampled according to sampling criteria and logically analyzed across different clock domains. Furthermore, the signal groups may be analyzed at desired resolution and granularity levels.

In one embodiment of the present invention, a plurality of signals is received from various data sources internal to an IC. These signals are selected and may be combined into various signal groups via a multiplexer. A memory, such as a RAM, is provided that stores state and/or timing information associated with these signal groups. The memory may also receive a sampling clock signal that may be used to determine sampling criteria for the signals. These stored signals may be further interfaced physically with a device outside the IC that analyzes the sampled signals. The present invention also provides a feature of controlling the multiplexing rate and sampling rate of these signal groups.

In one embodiment of the invention, the memory may include a counter for providing a time stamp for the data that is being stored. The present invention may further provide a filter for identifying particular data that should be stored or restricting other data from the storage process. For example, a filter may be defined to sample data traveling in a particular direction or slicing data to store particular bits within a data stream.

In yet another embodiment of the invention, a control device is provided for enabling the capture of selected signal groups either via control parameters or the application of a triggering event.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

An apparatus and a method for dynamic on-chip logic analysis are disclosed. In one embodiment of the present invention, internal IC signals are selected and stored within a memory buffer. This memory buffer may store state, timing information, and other related information to the internal IC signals. The buffer may be clocked internally or from an independent source to allow the analysis of different signal groups across different clock domains. These internal signal groups may be dynamically selected to examine the internal nets within an IC at varying resolution or granularity.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different computing systems and devices. The embodiments of the present invention may be present in hardware, software or firmware. Structures and devices shown below in block diagram are illustrative of exemplary embodiments of the invention and are meant to avoid obscuring the invention. Furthermore, connections between components within the figures are not intended to be limited to direct connections. Rather, data between these components may be modified, re-formatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

Figure 1:
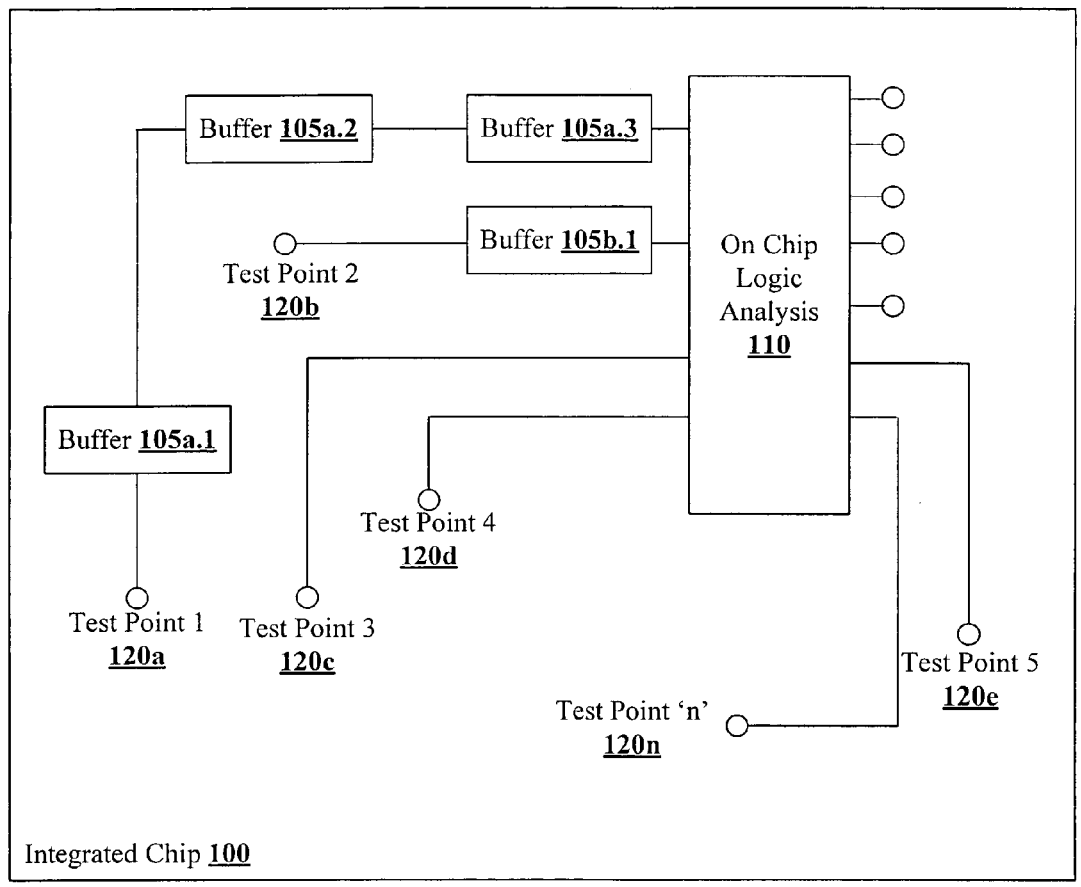
FIG. 1 illustrates a high-level operation of an on-chip logic analysis apparatus according to one embodiment of the invention.

FIG. 1 illustrates an IC 100 in which high-level operation of the logic analysis module 110 may be described. The logic analysis module 110 comprises n number of pins for receiving plurality of signals from n number of test points 120. These test points 120 provide various tap structures in which specific locations within the IC 100 may be tested. In one embodiment, these test points 120 reside on traces within the IC 100. The logic analysis module 110 also includes pins or interfaces that allow an external signal analysis tool to interface and retrieve the data stored on the logic analysis module 110.

Prior to testing one or more of the locations within the IC 100, data may be generated and transmitted on specific trace structures so the IC, or portion thereof, may be analyzed. The signals to be tested are tapped from one or more of the test points 120 and multiplexed. The multiplexed signals are then loaded into a memory, located within the IC, using one of various techniques (e.g. the signals may be loaded serially or in parallel). For example, the memory may receive an 8-bit data stream defined by the memory's pattern loading scheme. Additionally, the data stored in the memory may be retrieved in various ways (e.g. serially or in parallel) for use by an external signal analysis device.

An address channel may also be set up to have memory addresses that are in sequenced with time. Once a signal is captured, the address of the signal is added in a list where the memory addresses are stored. Thereafter, a test engineer may analyze the stored data using a device external to the IC.

The logic analysis module 110 may also be designed within the IC to minimize the trace distances. Additionally, the logic analysis module 110 and intermediary buffers may be located to simplify synchronization characteristics of the captured signals. An intermediate buffer or buffers 105 may be used for one of the test points 120 to store the critical timings of the net that is being probed. Other test points may have several buffers 105 between the memory and the test point 120, depending upon the location of the trace relative to the logic analysis module 110.

In one embodiment of the invention, multiple buffers 105 may be used, to ensure that a multiplexer, within the logic analysis module 110, appropriately synchronizes the captured data before storage. Furthermore, the captured data may also be latched and can be used to make various sub-design analysis system that address the return timing constraints of the captured data. The buffers may also contain pre-recorded data that may be used to test specific trace paths and subsequently stored by the logic analysis module 110.

B. Logic Analysis Module

Figure 2:
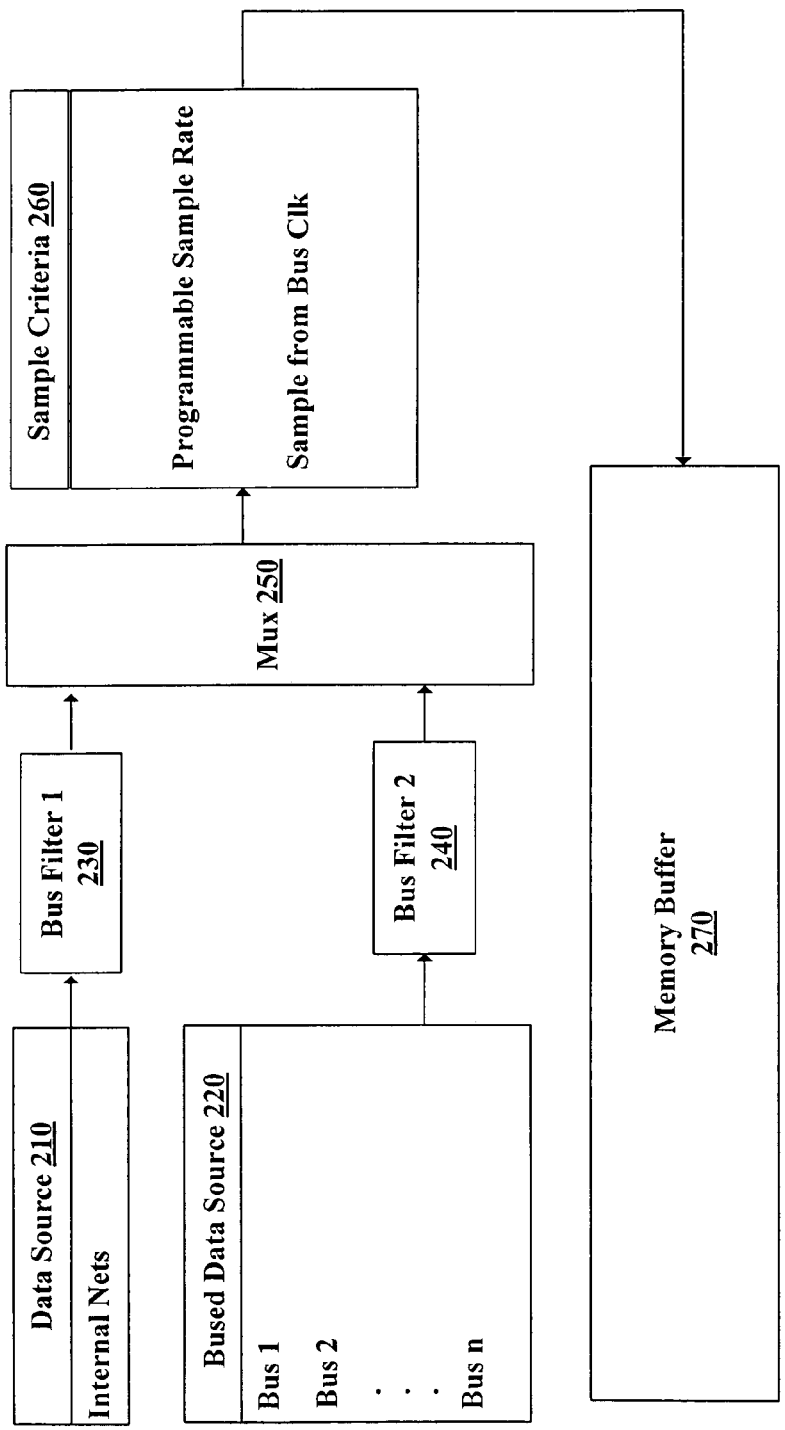
FIG. 2 is a block diagram illustrating a dynamic on-chip logic analysis apparatus according to one embodiment of the invention.

FIG. 2 illustrates a logic analysis module 110, which is located within an IC, according to one embodiment of the invention. The logic analysis module 110 comprises a memory buffer 270, such as a RAM, that stores state and timing information received from selected internal IC signals. As mentioned earlier, the internal signals are multiplexed before being loaded into the RAM by a multiplexer 250 that is coupled to the memory buffer 270. One or more filters 230, 240 may also be included between the data sources 210, 220 and the multiplexer 250 for selecting or removing certain types of data or signals prior to being multiplexed. Specifically, a first bus filter 230 may filter or otherwise modify the captured signal from one or more data sources 210. A second bus filter 240 may filter or otherwise modify the captured signal from one or more bused data sources 220. This filtering process, multiplexing or storage of captured data may be controlled or triggered to allow conditional capturing of the selected signal groups.

As mentioned above, the IC signals are received from various data sources including the internal nets 210 and the bused data source 220 within an IC. The data from the internal net data source 210 may be defined as bits (1's and 0's), which travel along a trace within the IC. The bused data source 220 may contain 'n' number of bused traces which also transmit bits in parallel. Typically, these buses may also carry critical control signals that control the operation of various modules located within the IC or devices located outside of the IC.

The logic analysis module 200 includes various embodiments in which sample criteria 260 may be used to define which captured data is sampled and stored within the memory buffer 270. These sample criteria may also allow a test engineer to analyze the synchronization of captured data. For instance, the test engineer may be less concerned with data states and may just prefer looking at the timing constraints of the captured data. If the timing constraints are faulty, then the engineer may be able to correct the synchronization of certain corrupted data to better match the system's timings.

A test engineer may also look at certain types of data that he/she wants to tap out of the trace by using the filter 210, 220 within the logic analyzer module 200. For example, the filters 210, 220 may perform several functions such as enabling the transaction of either the entire bused data or only certain bits therein. Moreover, specific sampling of the control signals may also be accomplished using the filters 210, 220. The filter or filters 210, 220 may be set up with certain bused filter rate or a filter may be set up to sample a data traveling from one point to other point in only one direction. For instance, if a "READ" or "WRITE" command is received from the bused data source 220, the data traveling from the source to the multiplexer in response to that command may be analyzed in only one direction. Specifically, the filter 210, 220 may prevent any data traveling in the opposite direction to be captured by the logic analysis module 200.

In yet another embodiment of the invention, it may also be possible to detect any changes occurring in the captured data at any instant while sampling. For example, a series of zero bits may be indicative of a failure within the IC. The logic analysis module 200 may detect such an instance and respond accordingly, such as by identifying a failure or shutting off. The logic analysis module 200 may also filter out certain data if it detects that same data is being transmitted in particular intervals. Furthermore, the filters 210, 220 may allow the logic analysis module 200 to slice captured data in a particular manner. For example, in a 32-bit data bus, the logic analysis module 200 may look at particular sliced data such as data at bit-1 or data at bit-8 etc.

Figure 3:
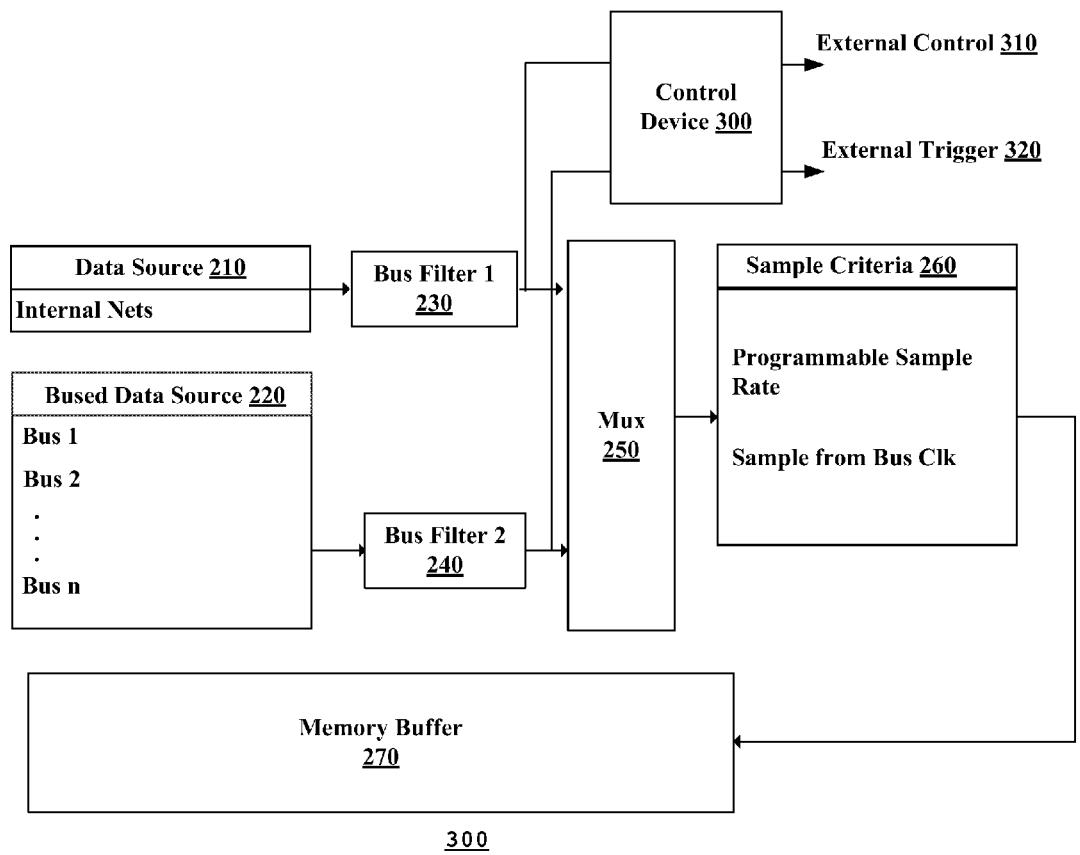
FIG. 3 is a block diagram illustrating a dynamic on-chip logic analysis apparatus including a control module according to one embodiment of the invention.

FIG. 3 illustrates a logic analysis module 300, having a control device 305, according to one embodiment of the invention. The control device 305 may control the sampling of the selected data into the memory buffer 270 in relation to either control data or triggering events.

In one embodiment, the control device 305 provides the programmable sampling rate and multiplexing rate for the logic analysis module 300. The control device 305 may also control the filtering of certain data. The data inputs into the buffer memory 270 are loaded at a particular rate or MUX rate, which may be adjusted by the control device 305. Because the MUX rate relates to the instantaneous rate at which the captured data is to be sampled, the control device 305 may also provide this rate to memory buffer 270. In one embodiment, the control device 305 may be externally controlled 310 to allow a test engineer to define certain parameters such as sampling rates. In another embodiment, the control device 305 may have a triggering event 320, which may be defined externally, that controls certain aspects and functions of the logic analysis module 300.

Figure 4:
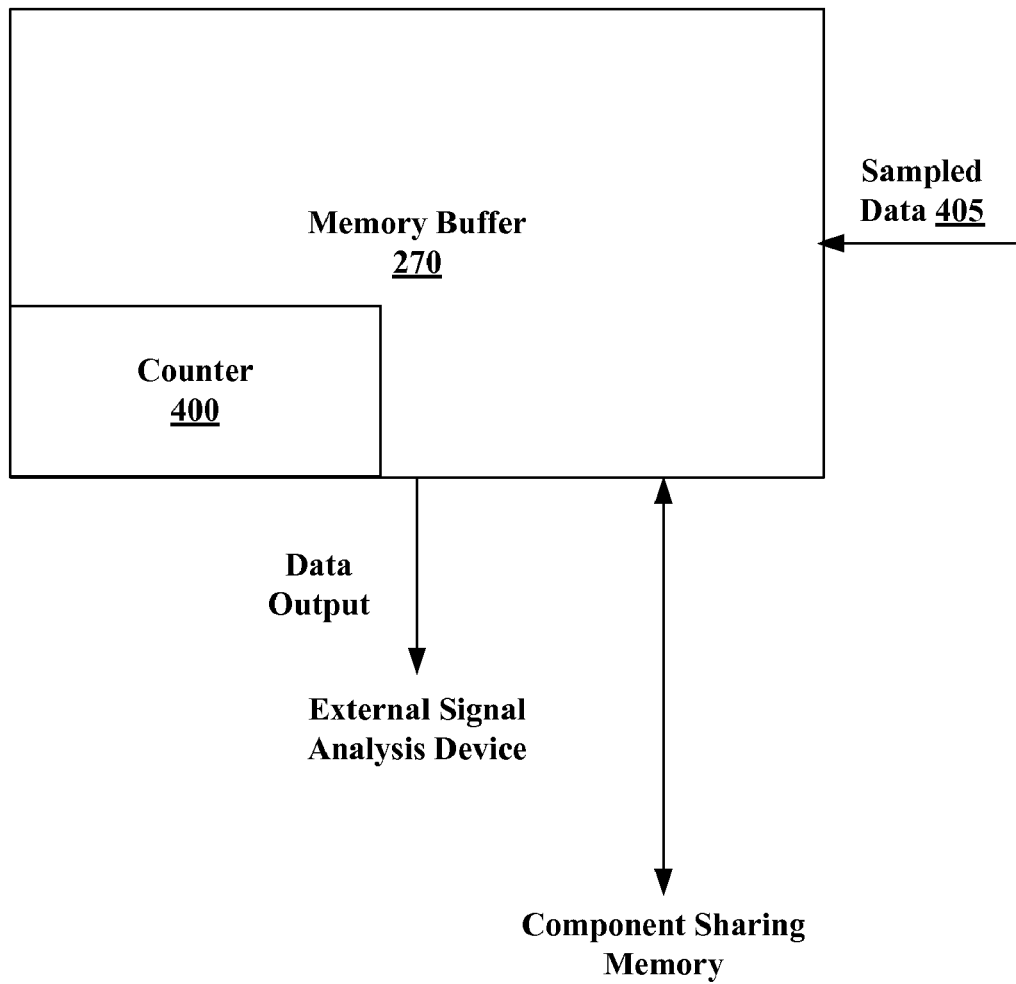
FIG. 4 is illustrates a RAM memory having a counter for providing a time stamp for the sampled data that is being stored in the RAM.

FIG. 4 shows a block diagram of memory buffer 270 that contains a counter 400 according to one embodiment of the invention. This counter 400 may provide a time stamp for data being stored in the memory 270. Accordingly, a time associated with a failure may be provided to a test engineer for further analysis.

In another embodiment of the invention, the memory buffer 270 may be realized through a pre-existing RAM or memory located within the particular IC. The actual size of the memory buffer may vary depending on the analysis requirements and size of the pre-existing memory.

The present invention provides increased ability to analyze on-chip signal behavior in debug scenarios. This in turn provides better fault coverage, which means fewer IC revisions and overall less money spent on designs. Additionally, the invention provides logical verification without additional analysis equipment. A customer of the IC with this feature could obtain analysis information and transmit this remotely to the designers for debug/verification purposes. Lastly, the present invention provides flexibility to examine and analyze any internal net regardless of clock domain or signal group.

The present invention may be alternatively used to actually design a functioning logic analysis block into the IC. Further, the invention could be used in a variety of areas for self-diagnostic purposes, performance analysis of logical design/architecture, as well as the previously mentioned debug and logical verification fields.

The foregoing description of the invention has been described for purposes of clarity and understanding. It is not intended to limit the invention to the precise form disclosed. Various modifications may be possible within the scope and equivalence of the appended claims.

We claim:

1. A method for analysis of internal signals within an integrated circuit, the method comprising:
   receiving a plurality of internal signals from data taps located within the integrated circuit;
   buffering a first portion of the internal signals to synchronize the first portion of the internal signals with a second portion of the internal signals;
   multiplexing the plurality of internal data signals, which multiplexing is controlled by a control device with an interface external to the integrated circuit;
   applying a filter to at least one signal within the plurality of internal signals prior to multiplexing the plurality of internal data signals;
   sampling the multiplexed signal, within the integrated circuit, according to at least one sampling criteria; and
   storing the sampled signal in a memory located within the integrated circuit.

2. The method of claim 1 wherein sampling the multiplexed signal is configured for a plurality of clock domains.

3. The method of claim 1 wherein the data sources comprise internal bus data.

4. The method of claim 1 wherein the control device applies a triggering event in its control of the multiplexing of the plurality of internal data signals.

5. The method of claim 4 further comprising the step of capturing the multiplexed signal dynamically according to the triggering event.

6. The method of claim 1 further comprising the step of providing the stored sampled signal to an external signal analysis device.

7. An integrated circuit apparatus comprising:
   a plurality of test points located within an integrated circuit from which a signal is tapped;
   at least one filter, coupled to receive information from the plurality of test points, the at least one filter removing a portion of the information from the tapped signal;
   a plurality of buffers, located within the integrated circuit, that synchronizes a first portion of the signal from the plurality of test points to a second portion of the signal from the plurality of test points;
   a logic analysis module, coupled to the plurality of test points and located within the integrated circuit, that samples, and stores data tapped and filtered from the plurality of test points;
   an interface on which the stored data may be provided to a device external to the integrated; and
   at least one buffer positioned between a test point, within the plurality of test points, and the logic analysis module.

8. The apparatus of claim 7 wherein the data is sampled according to sample criteria defined by a user.

9. The apparatus of claim 7 wherein the data tapped from the plurality of test points is multiplexed into a signal group.

10. The apparatus of claim 9 wherein the logic analysis module comprises a control device having an external interface that allows for user configuration and is coupled to a multiplexer to control the multiplexing of the data tapped from the plurality of test points.

11. The apparatus of claim 7 wherein the logic analysis module comprises a random access memory device coupled to store the data tapped from the plurality of test points.

12. The apparatus of claim 11 wherein the random access memory device is shared with another component within the integrated circuit.

13. A logic analysis module, located within an integrated circuit, the module comprising:
   a first interface on which externally filtered data tapped from signals, internal to the integrated circuit, are provided;

a plurality of buffers that synchronizes a first portion of the filtered data from the plurality of test points to a second portion of the filtered data from the plurality of test points;

a multiplexer, coupled to the first interface, that multiplexes the filtered data into a group signal;

a control device, coupled to the multiplexer and having at least one external interface, that controls the rate at which the multiplexer operates;

a data sampler, coupled to the multiplexer, that samples the group signal according to sample criteria; and a memory device, coupled to the data sampler and located within the integrated circuit, that stores the sampled group signal.

14. The logic analysis module of claim 13 further comprising a second interface on which the stored data may be provided to an external device.

* * * * *